United States Patent
Gu et al.

(10) Patent No.: US 11,843,034 B2
(45) Date of Patent: Dec. 12, 2023

(54) LATERAL BIPOLAR TRANSISTOR

(71) Applicant: GLOBALFOUNDRIES U.S. Inc., Malta, NY (US)

(72) Inventors: Man Gu, Malta, NY (US); Haiting Wang, Clifton Park, NY (US); Jagar Singh, Clifton Park, NY (US)

(73) Assignee: GLOBALFOUNDRIES U.S. INC., Malta, NY (US)

( * ) Notice: Subject to any disclaimer, the term of this patent is extended or adjusted under 35 U.S.C. 154(b) by 0 days.

(21) Appl. No.: 17/529,002

(22) Filed: Nov. 17, 2021

(65) Prior Publication Data

US 2023/0062747 A1    Mar. 2, 2023

Related U.S. Application Data

(60) Provisional application No. 63/236,879, filed on Aug. 25, 2021.

(51) Int. Cl.
| | | |
|---|---|---|
| H01L 29/10 | (2006.01) | |
| H01L 29/66 | (2006.01) | |
| H01L 29/735 | (2006.01) | |
| H01L 29/423 | (2006.01) | |

(52) U.S. Cl.
CPC .... *H01L 29/1008* (2013.01); *H01L 29/42304* (2013.01); *H01L 29/6625* (2013.01); *H01L 29/735* (2013.01)

(58) Field of Classification Search
CPC ............. H01L 27/067; H01L 27/07229; H01L 27/0783; H01L 29/1008; H01L 29/6625
See application file for complete search history.

(56) References Cited

U.S. PATENT DOCUMENTS

| | | |
|---|---|---|
| 7,897,995 B2 | 3/2011 | Yang et al. |
| 7,943,995 B2 | 5/2011 | Kang et al. |
| 8,288,758 B2 | 10/2012 | Ning et al. |
| 8,310,027 B2 | 11/2012 | Russ et al. |
| 8,906,755 B1 * | 12/2014 | Hekmatshoartabari ...... H01L 27/1207 438/234 |
| 9,059,016 B1 | 6/2015 | Hekmatshoar-Tabari et al. |
| 9,059,195 B2 | 6/2015 | Cai et al. |
| 9,263,583 B2 | 2/2016 | Cai et al. |
| 9,502,504 B2 | 11/2016 | Cai et al. |
| 9,553,145 B2 | 1/2017 | Harame et al. |
| 9,536,788 B1 | 6/2017 | Ning et al. |
| 9,748,369 B2 | 8/2017 | Liu |

(Continued)

OTHER PUBLICATIONS

Yau et al., "SiGe-on-insulator symmetric lateral bipolar transistors," IEEE SOI-3D-Subthreshold Microelectronics Technology Unified Conference (S3S), Nov. 23, 2015, 2 pages.

(Continued)

*Primary Examiner* — Wasiul Haider
(74) *Attorney, Agent, or Firm* — Francois Pagette; Andrew M. Calderon; Calderon Safran & Cole PC

(57) ABSTRACT

The present disclosure relates to semiconductor structures and, more particularly, to a lateral bipolar transistor and methods of manufacture. The structure includes a lateral bipolar junction transistor including an extrinsic base region and a bilayer dielectric spacer on sidewalls of the extrinsic base region, and a p-n junction positioned under the bilayer dielectric spacer between the extrinsic base region and at least an emitter region.

20 Claims, 16 Drawing Sheets

(56) References Cited

U.S. PATENT DOCUMENTS

| | | |
|---|---|---|
| 9,786,656 B1 | 10/2017 | Anderson et al. |
| 2002/0142558 A1 | 10/2002 | Hsu |
| 2006/0060941 A1 | 3/2006 | Sun et al. |
| 2013/0260526 A1* | 10/2013 | Cai .................... H01L 29/66242 257/E21.608 |
| 2015/0097247 A1* | 4/2015 | Cai ....................... H01L 27/092 257/370 |
| 2015/0102348 A1 | 4/2015 | Cai et al. |
| 2015/0236093 A1* | 8/2015 | Chan .................. H01L 29/0821 257/565 |
| 2015/0303185 A1* | 10/2015 | Preisler ............. H01L 29/41708 257/370 |
| 2016/0276807 A1* | 9/2016 | Cai ......................... H01S 5/026 |
| 2018/0083126 A1* | 3/2018 | Hashemi ............... H01L 29/167 |

OTHER PUBLICATIONS

Raman et al., "On the Performance of Lateral SiGe Heterojunction Bipolar Transistors With Partially Depleted Base" IEEE Transactions on Electron Devices, vol. 62, No. 8, Aug. 2015, 7 pages.
Application and Drawings for U.S. Appl. No. 17/509,384, filed Oct. 25, 2021, 27 pages.
Final Office Action in U.S. Appl. No. 17/509,384 dated May 31, 2023, 12 pages.
Response to Final Office Action in U.S. Appl. No. 17/509,384, filed Jul. 7, 2023, 8 pages.
Office Action in U.S. Appl. No. 17/509,384 dated Feb. 16, 2023, 12 pages.
Response to Office Action in U.S. Appl. No. 17/509,384, filed May 16, 2023, 9 pages.
Notice of Allowance in U.S. Appl. No. 17/509,384 dated Jul. 27, 2023, 17 pages.

* cited by examiner

LATERAL BIPOLAR TRANSISTOR

BACKGROUND

The present disclosure relates to semiconductor structures and, more particularly, to a lateral bipolar transistor and methods of manufacture.

Bipolar transistors can be vertical transistors or lateral transistors. In a vertical bipolar transistor, carriers flow in a vertical direction. Since a collector region is formed in a position deep from a wafer surface, collector resistance increases, thus limiting the transistor performance especially for high-speed operation. In addition, the transistor requires a high-concentration buried layer, a collector epitaxial layer, and a deep trench isolation, etc. Consequently, the number of process steps increases and thus does the costs. On the other hand, the lateral bipolar transistor is simpler in structure than the vertical bipolar transistor. Also, in a lateral bipolar transistor, a collector electrode can be directly brought into contact with a collector region, which is advantageous for high-speed operation.

SUMMARY

In an aspect of the disclosure, a structure comprises: a lateral bipolar junction transistor comprising an extrinsic base region and a bilayer dielectric spacer on sidewalls of the extrinsic base region, and a p-n junction positioned under the bilayer dielectric spacer between the extrinsic base region and at least an emitter region.

In an aspect of the disclosure, a structure comprises: a lateral bipolar junction transistor comprising: an extrinsic base region; a bilayer dielectric spacer on sidewalls of the extrinsic base region; an extrinsic collector separated from the extrinsic base region by the bilayer dielectric spacer; and an extrinsic emitter separated from the extrinsic base region by the bilayer dielectric spacer; and a metal oxide semiconductor field effect transistor isolated from the lateral bipolar junction transistor, the metal oxide semiconductor field effect transistor comprising same semiconductor material as the extrinsic base region.

In an aspect of the disclosure, a method comprises: forming a lateral bipolar junction transistor comprising an extrinsic base region and a bilayer dielectric spacer on sidewalls of the extrinsic base region, and forming a p-n junction positioned under the bilayer dielectric spacer between the extrinsic base region and at least an emitter region.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

Figure 1:
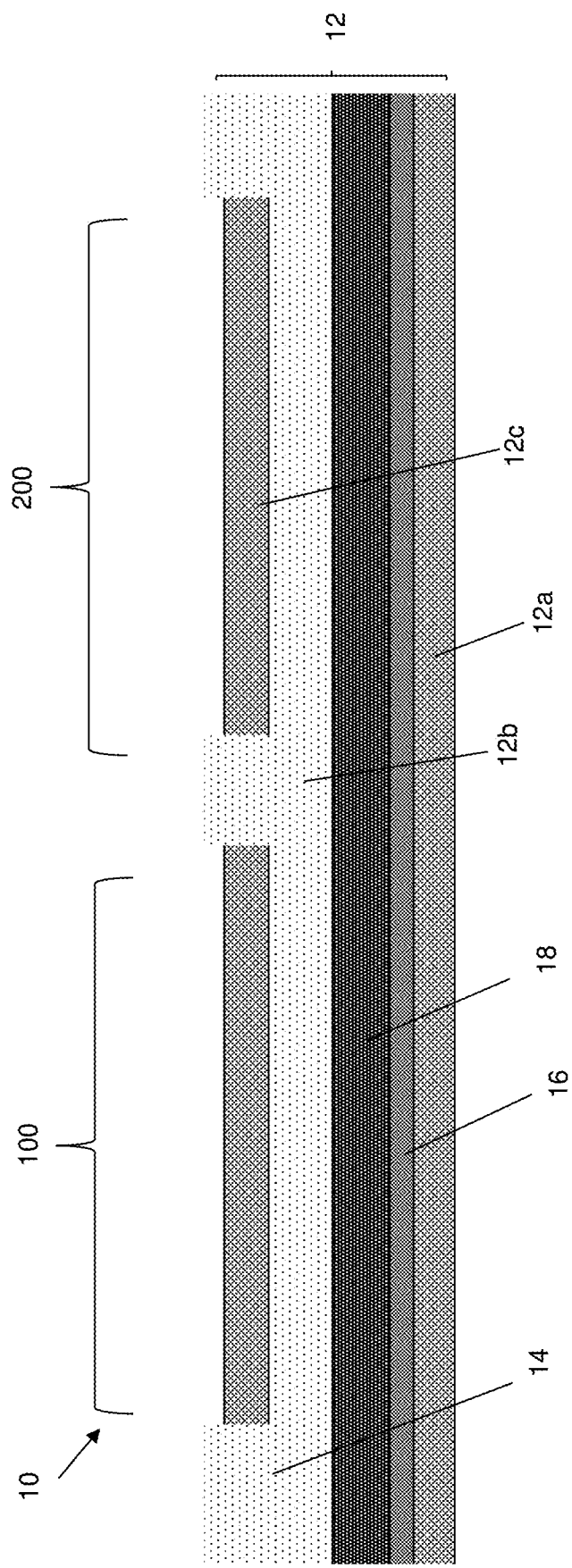
FIG. 1 shows a substrate with shallow trench isolation structures, amongst other features, and respective fabrication processes in accordance with aspects of the present disclosure.

The present disclosure relates to semiconductor structures and, more particularly, to a lateral bipolar transistor and methods of manufacture. More specifically, the present disclosure relates to a lateral bipolar transistor integrated with CMOS transistors, e.g., NFET and/or PFET, in semiconductor-on-insulator (SOI) technology. In embodiments, the lateral bipolar transistor comprises a lateral NPN bipolar transistor which is fully compatible with existing fully-depleted (FD) SOI CMOS technology integration flows. For example, in embodiments, the lateral NPN bipolar transistor includes a p-n junction formed within SOI and positioned under a bilayer spacer interface. Advantageously, the lateral bipolar transistor provides for high voltage RF device applications (e.g., low noise amplifiers and power amplifiers), with the SOI providing additional benefits of reduced capacitance and noise isolation.

In embodiments, the lateral bipolar transistor has very thin Si layer $T_{Si}$, e.g., approximately 6 nm, narrow base width $W_B$, e.g., <40 nm, and epitaxial growth of extrinsic emitter/collector for parasitic reduction which leads to significant $f_T$ and $f_{max}$ improvement, compared to conventional devices. For example, the lateral bipolar transistor may include a self-aligned extrinsic base portion provided by conventional gate patterning processes to enable a narrow base width of <40 nm. In addition, the extrinsic emitter/collector regions may be formed by an epitaxial growth process to lower the emitter/collector resistance. Moreover, the process flows described herein support wider gate pitch with wider emitter/collector width, compared to conventional processed flow, thereby providing additional process variations for RF applications.

In more specific embodiments, the lateral NPN bipolar transistor includes a p-n junction positioned under a bilayer dielectric spacer interface between an extrinsic base and emitter/collector regions. The intrinsic emitter/collector regions may be formed within SOI with a same $T_{Si}$ as the intrinsic base region. In addition, the extrinsic emitter/collector may be a faceted epitaxial semiconductor (N+ epitaxial semiconductor) which is separated (e.g., not in contact with) from the intrinsic base, e.g., P+SiGe base (i.e., separated by spacer), and the extrinsic emitter/base/collector width may be slightly smaller than the width of the intrinsic emitter/base/collector. Also, in embodiments, the lateral bipolar transistor may be fabricated on a same chip with CMOS devices for RF SOC applications, using a same spacer/NEPI structure on the lateral NPN bipolar transistor and CMOS-NFET.

The lateral bipolar transistor of the present disclosure can be manufactured in a number of ways using a number of different tools. In general, though, the methodologies and tools are used to form structures with dimensions in the micrometer and nanometer scale. The methodologies, i.e., technologies, employed to manufacture the lateral bipolar transistor of the present disclosure have been adopted from integrated circuit (IC) technology. For example, the structures are built on wafers and are realized in films of material patterned by photolithographic processes on the top of a wafer. In particular, the fabrication of the lateral bipolar transistor uses three basic building blocks: (i) deposition of thin films of material on a substrate, (ii) applying a patterned mask on top of the films by photolithographic imaging, and (iii) etching the films selectively to the mask.

FIG. 1 shows a substrate with shallow trench isolation structures, amongst other features, and respective fabrication processes in accordance with aspects of the present disclosure. In particular, the structure 10 of FIG. 1 includes a substrate 12 comprising a semiconductor-on-insulator (SOI) substrate with a PFET region 100 and a lateral bipolar junction transistor region 200. In embodiments the bipolar junction transistor region 200 comprises an NPN bipolar junction transistor, as an example.

The semiconductor-on-insulator (SOI) substrate 12 includes a semiconductor handle wafer 12a, an insulator layer 12b and a semiconductor layer 12c on the insulator layer 12b. The semiconductor handle wafer 12a provides mechanical support to the insulator layer 12b and the semiconductor layer 12c. The semiconductor layer 12c may be formed by a deposition process, such as chemical vapor deposition (CVD) or plasma enhanced CVD (PECVD). Alternatively, the semiconductor layer 12c may be formed using a smart cut process where two semiconductor wafers are bonded together with an insulator material between the two semiconductor wafers.

In the SOI implementation, the semiconductor handle wafer 12a and the semiconductor layer 12c may be composed of any suitable semiconductor material including, but not limited to, Si, SiGe, SiGeC, SiC, GaAs, InAs, InP, and other III/V or II/VI compound semiconductors. Moreover, the semiconductor handle wafer 12a and the semiconductor layer 12c may comprise any suitable single crystallographic orientation (e.g., a (100), (110), (111), or (001) crystallographic orientation). In further embodiments, the semiconductor layer 12c may be undoped SiGe material, which will form part of the intrinsic collector region, intrinsic base region, and intrinsic emitter region, all of which may have a same thickness, e.g., $T_{Si}$. In an illustrative example, the intrinsic collector region, intrinsic base region and intrinsic emitter region may be, e.g., approximately 6 nm.

Still referring to FIG. 1, the semiconductor handle wafer 12a may be a P+ substrate with a deep N-well implant 16 and a deep P-well 18 between the insulator layer 12b and the deep N-well 16. In embodiments, the wells 16, 18 may be used as a back gate contact with full forward and reverse back bias capabilities. The wells 16, 18 may be formed by conventional ion implantation processes as is known to those of skill in the art such that no further explanation is required for a complete understanding of the present disclosure.

The insulator layer 12b may include a dielectric material such as silicon dioxide, silicon nitride, silicon oxynitride, boron nitride or a combination thereof. In a preferred embodiment, the insulator layer 12b may be a buried oxide layer (BOX). The insulator layer 12b may be formed by a deposition process, such as CVD, PECVD or physical vapor deposition (PVD). In another embodiment, the insulator layer 12b may be formed using a thermal growth process, such as thermal oxidation, to convert a surface portion of the semiconductor handle wafer 12a to an oxide material, e.g., insulator layer 12b. In yet another embodiment, the insulator layer 12b can be formed by implanting oxygen atoms into a bulk semiconductor substrate and thereafter annealing the structure.

Still referring to FIG. 1, shallow trench isolation structures 14 are formed within the semiconductor layer 12c and extend to the insulator layer 12b. In embodiments, the shallow trench isolation structures 14 may be used to isolate the regions 100, 200. The shallow trench isolation structures 14 can be formed by conventional lithography, etching and deposition methods known to those of skill in the art. For example, a resist formed over the semiconductor layer 12c is exposed to energy (light) to form a pattern (opening). An etching process with a selective chemistry, e.g., reactive ion etching (RIE), will be used to form one or more trenches in the semiconductor layer 12c through the openings of the resist. Following the resist removal by a conventional oxygen ashing process or other known stripants, insulator material (e.g., $SiO_2$) can be deposited within the trenches by any conventional deposition process, e.g., chemical vapor deposition (CVD) processes. Any residual insulator material on the surface of the semiconductor layer 12c may be removed by conventional chemical mechanical polishing (CMP) processes.

Figure 2:
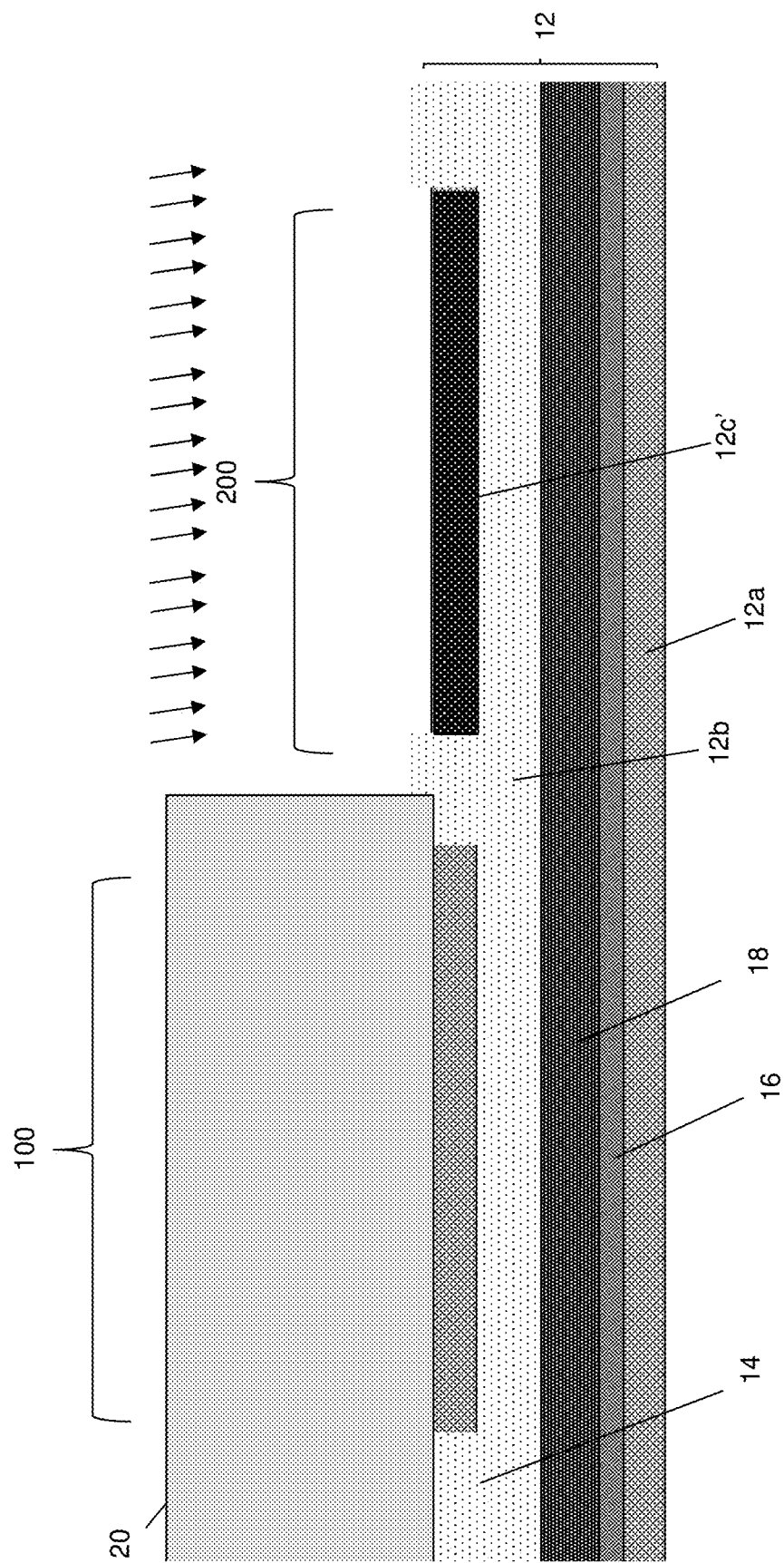
FIG. 2 shows formation of an intrinsic base region, amongst other features, and respective fabrication processes in accordance with aspects of the present disclosure.

FIG. 2 shows formation of an intrinsic base region, amongst other features. More specifically, as shown in FIG. 2, the region 200 may be subjected to an ion implantation process as depicted by the arrows to form an intrinsic region for a lateral bipolar transistor. In embodiments, the region 200 may be subjected to a P+ ion implantation process, e.g., $BF_2$ doping, to form a P+semiconductor layer 12c'. In embodiments the P+ semiconductor layer 12c' may be used as intrinsic base of the lateral bipolar junction transistor.

As with the formation of the wells 16, 18, a patterned implantation mask 20 may be used to define selected areas exposed for the implantations. In this case, the implantation mask 20 may be formed over the region 100 which is stripped after the implantation process. The implantation mask 20 may include a layer of a light-sensitive material, such as an organic photoresist, applied by a spin coating process, pre-baked, exposed to light projected through a photomask, baked after exposure, and developed with a chemical developer. The implantation mask 20 has a thickness and stopping power sufficient to block masked areas against receiving a dose of the implanted ions. The P-type dopants may be, e.g., Boron (B). The structure 10 may be subjected to a rapid thermal anneal process for dopant activation, followed by a clean process as is known in the art.

Figure 3:
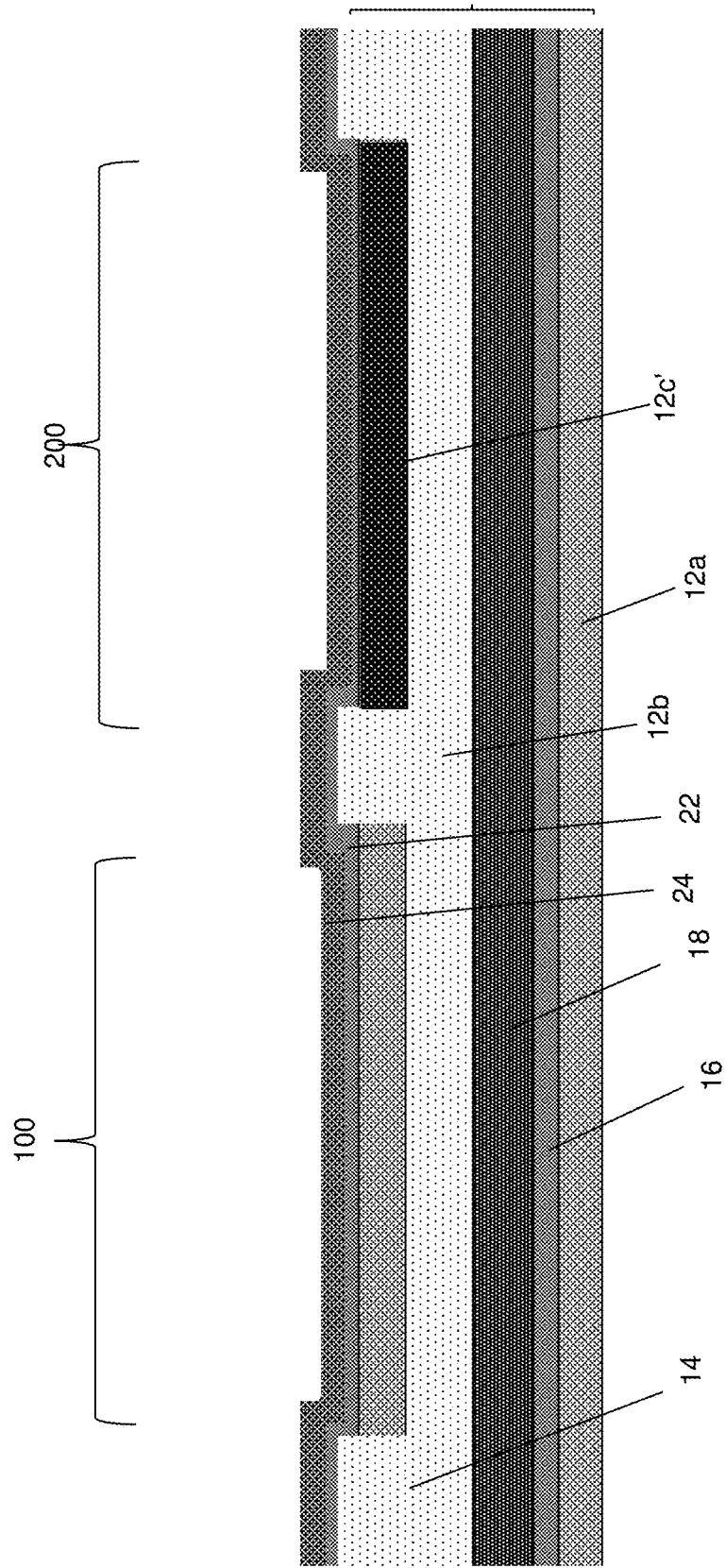
FIG. 3 shows gate material formed on the substrate, amongst other features, and respective fabrication processes in accordance with aspects of the present disclosure.

In FIG. 3, the implantation mask 20 may stripped from the region 100 using any conventional stripping techniques known in the art. A gate dielectric material 22 may be formed over regions 100, 200. In embodiments, the gate dielectric material 22 may be a high-k gate dielectric material, e.g., $HfO_2Al_2O_3$, $Ta_2O_3$, $TiO_2$, $La_2O_3$, $SrTiO_3$, $LaAlO_3$, $ZrO_2$, $Y_2O_3$, $Gd_2O_3$, and combinations including multilayers thereof. The gate dielectric material 22 may be blanket deposited by a conventional deposition method such as atomic layer deposition (ALD) or plasma enhanced chemical vapor deposition (CVD), amongst others.

Sill referring to FIG. 3, a gate material 24 may be formed on the gate dielectric material 22. In embodiments, the gate material 24 may comprise a work function metal(s). By way of example, the work function metal(s) may be metal materials used to fabricate a PFET device, e.g., Ti, TiAlC, Al, TiAl, TaN, TaAlC, TiN, TiC, and Co. The gate material 24 may be deposited by conventional deposition processes such as CVD.

Figure 4:
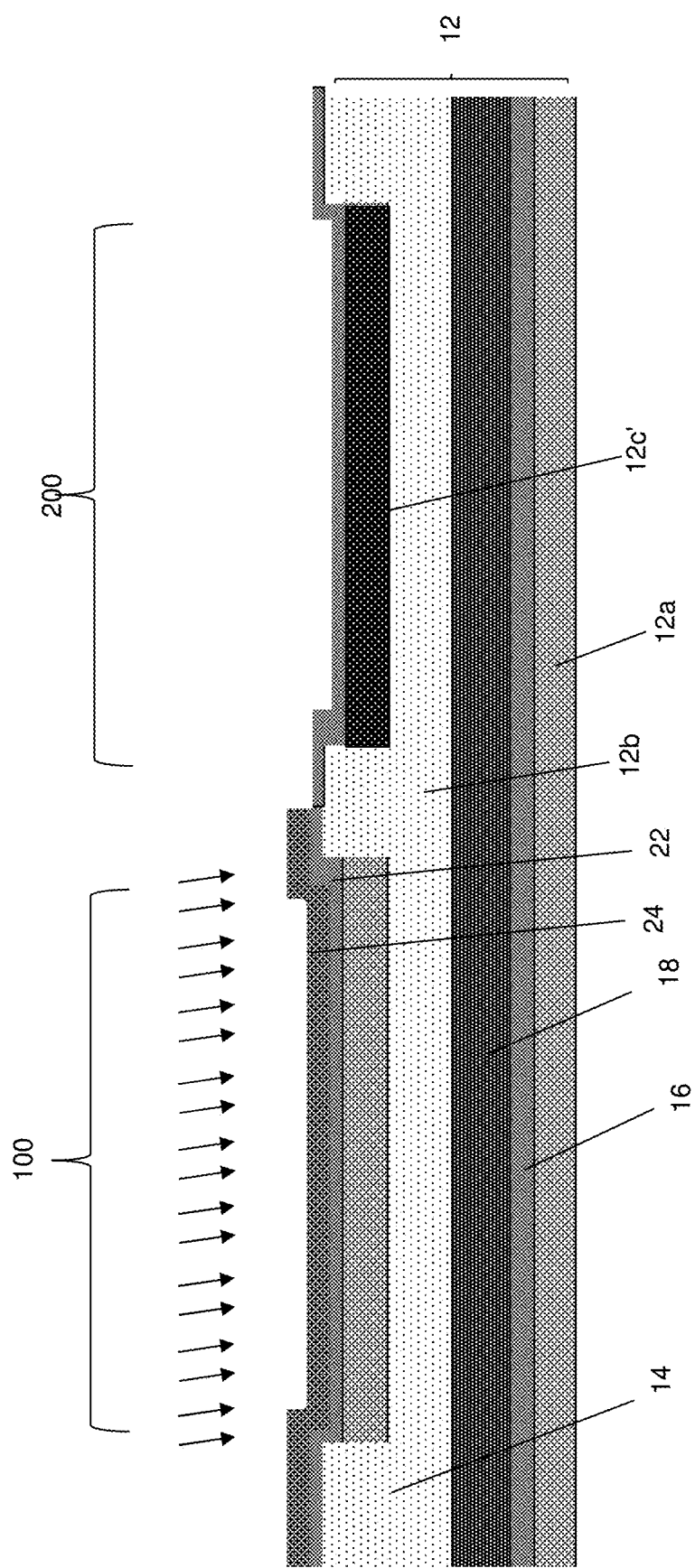
FIG. 4 shows removal of the gate material in a lateral bipolar transistor region, amongst other features, and respective fabrication processes in accordance with aspects of the present disclosure.

FIG. 4 shows removal of the gate material in a lateral bipolar transistor region 200. More specifically, as further shown in FIG. 4, the gate material 24 may be removed in region 200 by a conventional etching process, while protecting the gate material 24 in region 100, e.g., using a conventional lithography masking process. After mask removal, the structure may undergo an annealing process to drive in the gate material 24 into the gate dielectric material 22 in region 100 as depicted by the arrows, followed by a clean process to remove the remaining gate material 24.

Figure 5:
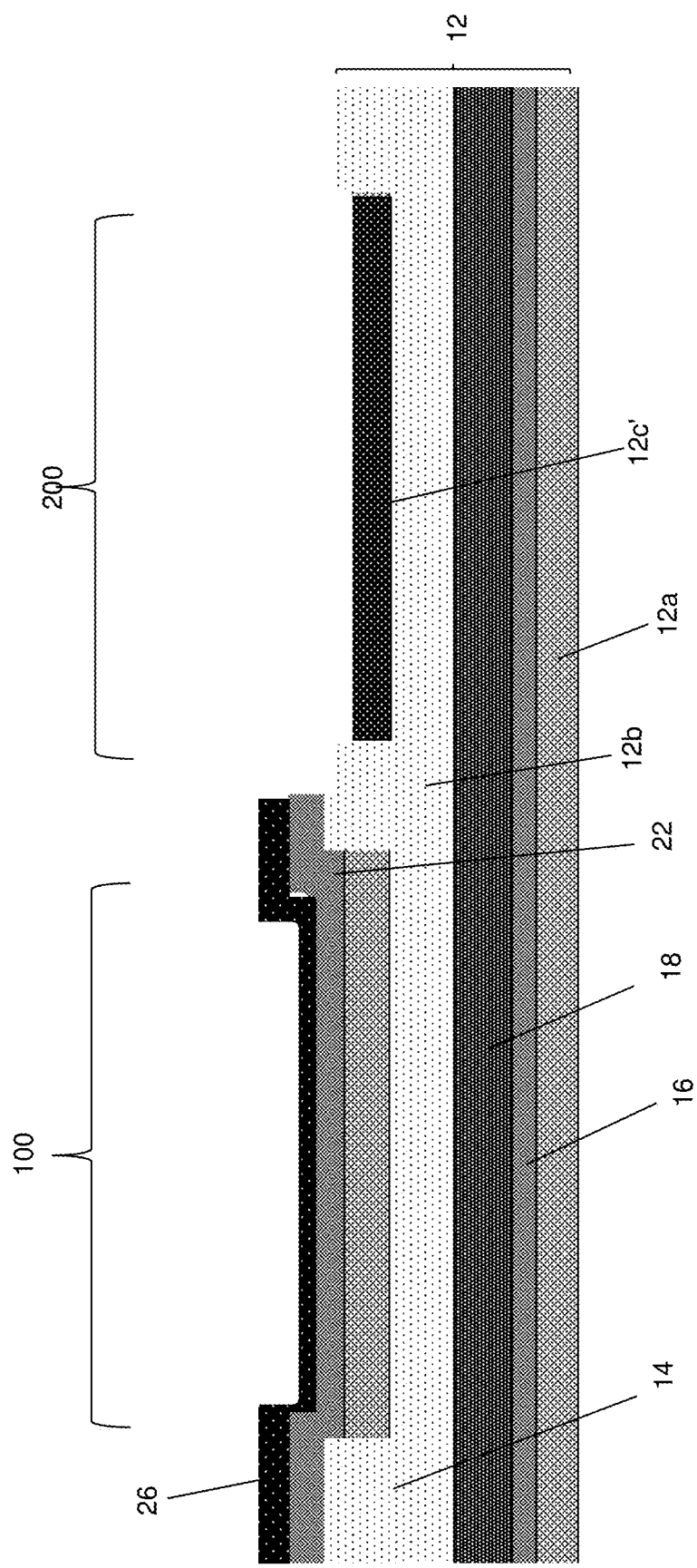
FIG. 5 shows final gate material in a CMOS region, amongst other features, and respective fabrication processes in accordance with aspects of the present disclosure.

As shown representatively in FIG. 5, a final gate material 26 may be blanket deposited over the regions 100, 200. In embodiments, the final gate material 26 may be a metal for a PFET device, as an example. The final gate material 26 and gate dielectric material 22 may then be stripped in region 200, similar to that described with respect to FIG. 4, e.g., using a lithography mask. For example, in this processing step, a same mask may be used to protect the gate dielectric material 22 and gate material 26 in region 100, while removing the gate dielectric material 22 and gate material 26 from region 200. In this way, region 200 is now devoid of any CMOS materials, e.g., gate materials, thereby exposing the semiconductor layer 12c' isolated by the shallow trench isolation regions 14. Also, it should be noted that the gate material 24 may go into gate dielectric material 22 by a drive-in anneal, with any remaining material 24 being removed after the anneal followed by deposition of the final gate material 26 on top of the gate dielectric material 22.

Figure 6:
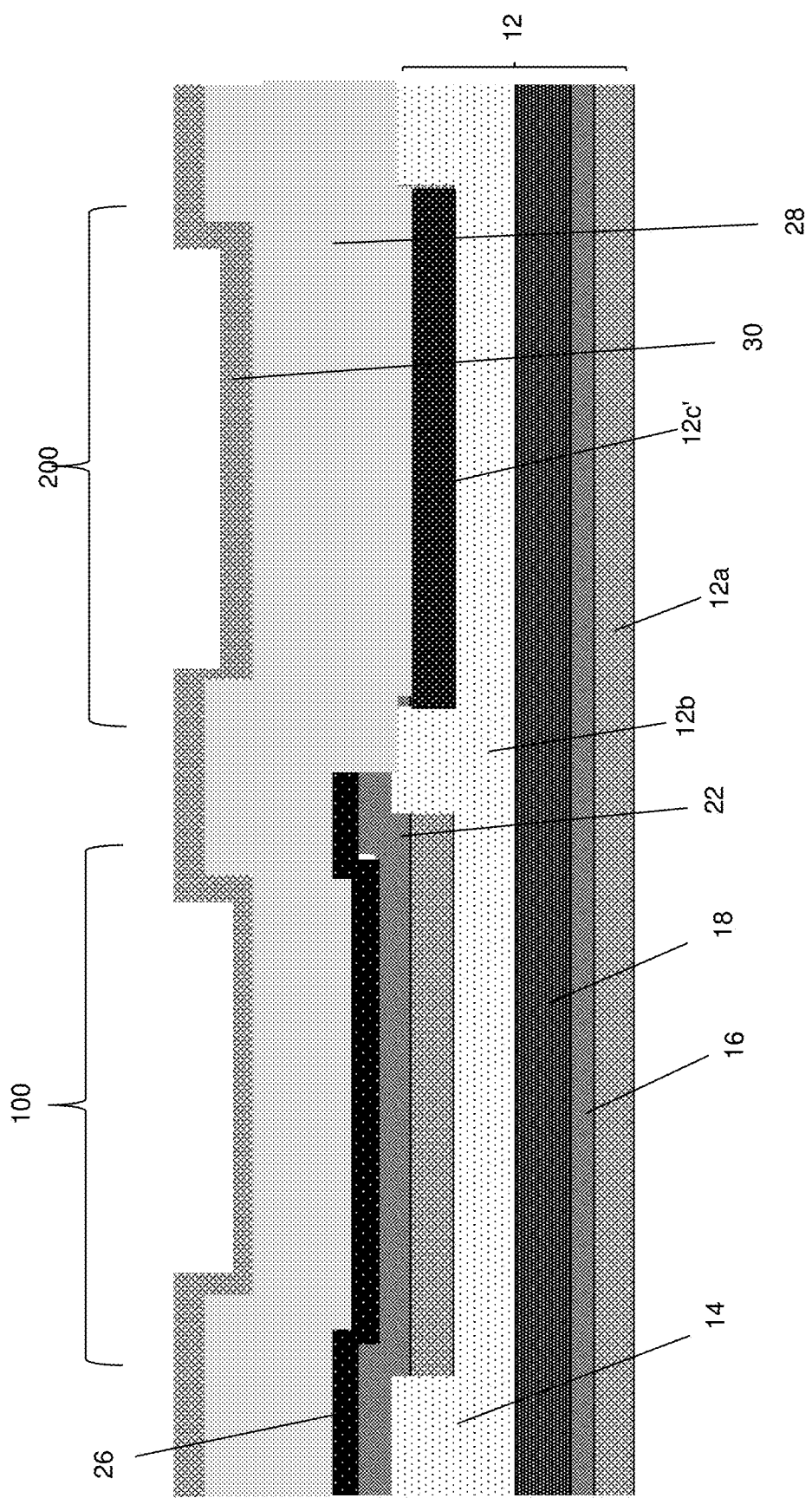
FIG. 6 shows semiconductor material and insulator material in both the CMOS region and lateral bipolar transistor region, amongst other features, and respective fabrication processes in accordance with aspects of the present disclosure.

As further shown in FIG. 6, a semiconductor material 28 and insulator material 30 are formed in regions 100, 200. More specifically, a semiconductor material 28 may be deposited over the gate material 26 in region 100 and over the semiconductor layer 12c' in region 200. In embodiments, the semiconductor material 28 may be amorphous silicon, e.g., polysilicon material, which can be used for both a gate structure in region 100 and extrinsic base region in region 200 as described below. The insulator material 30 may be an oxide material deposited by a conventional deposition method, e.g., CVD.

Figure 7:
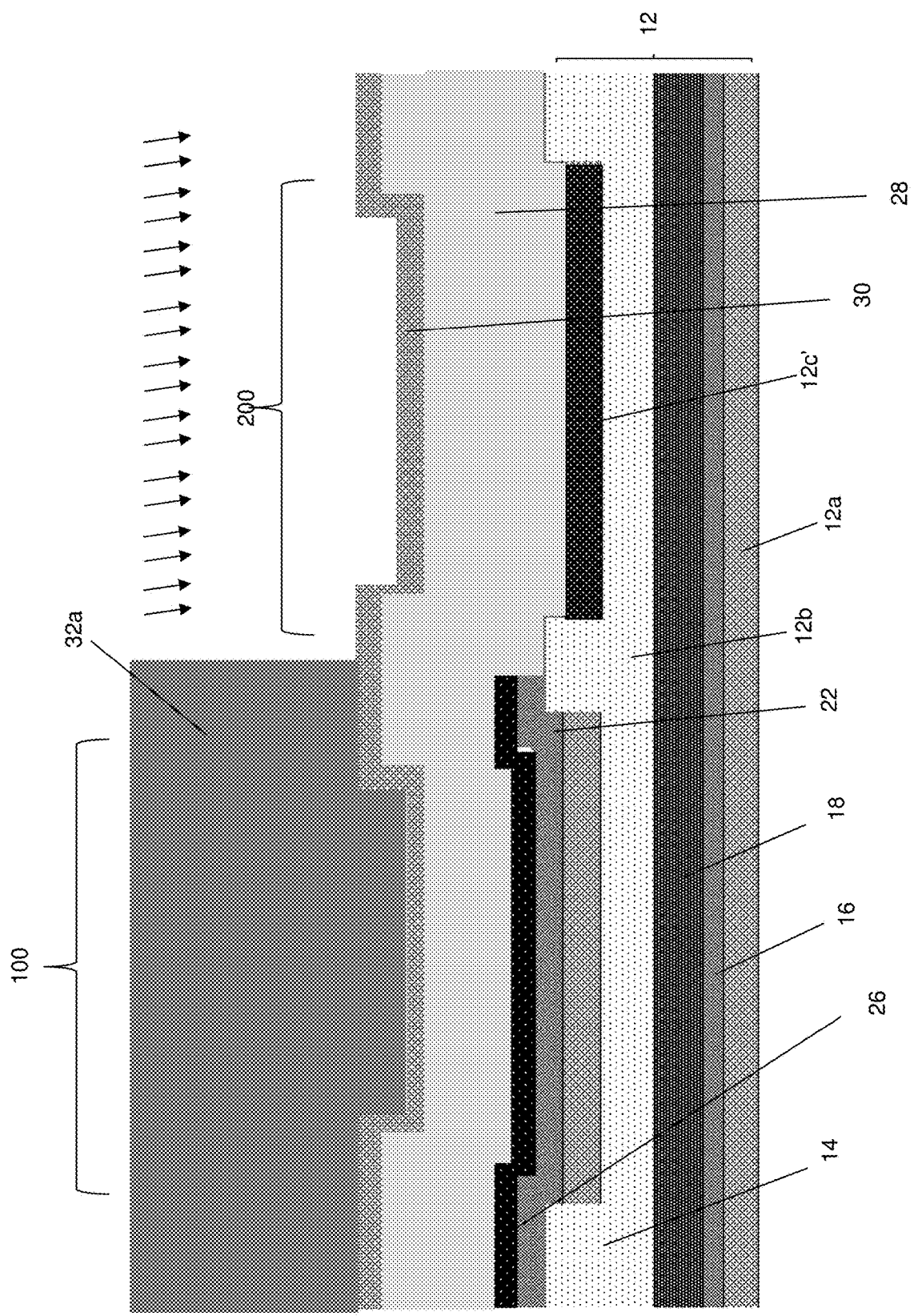
FIGS. 7 and 8 show separate ion implantation processes performed in the CMOS region and the lateral bipolar transistor region, amongst other features, and respective fabrication processes in accordance with aspects of the present disclosure.
Figure 8:
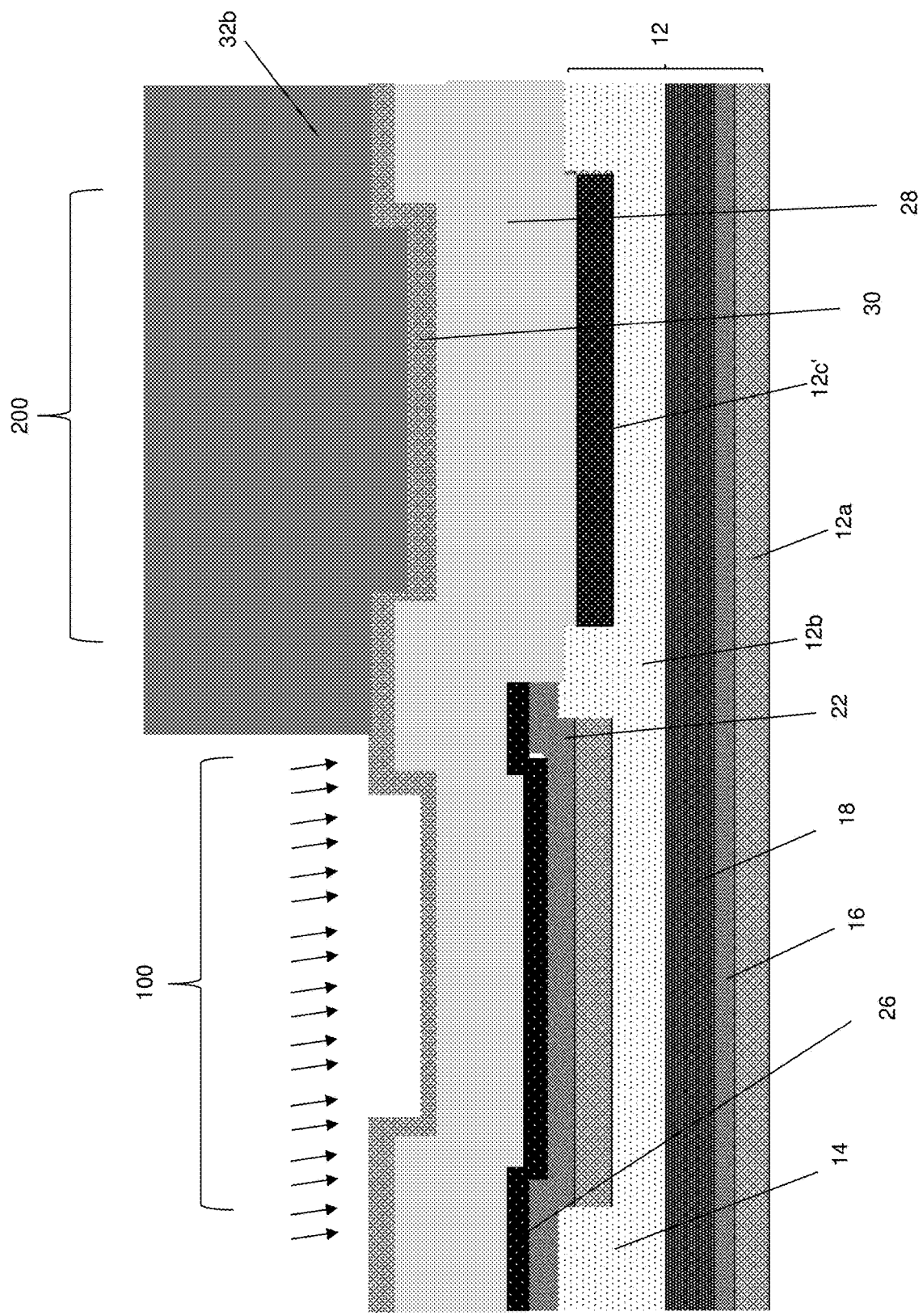

Referring to FIGS. 7 and 8, separate ion implantation processes may be performed in regions 200 and 100, respectively, using a respective implantation mask 32a, 32b. It should be noted that the ion implantation processes may occur in either order, e.g., region 100 then region 200 or vice versa. More specifically, in FIG. 7, while protecting the region 100 with mask 32a, an ion implantation process may be performed in the region 200. In embodiments, the implantation process is a P-type dopant, e.g., Boron. Similarly, in FIG. 8, while protecting the region 200 with mask 32b, an ion implantation process may be performed in the region 100. In embodiments, the implantation process is a N-type dopant, e.g., As, in order to form an N+ polysilicon gate.

Figure 9:
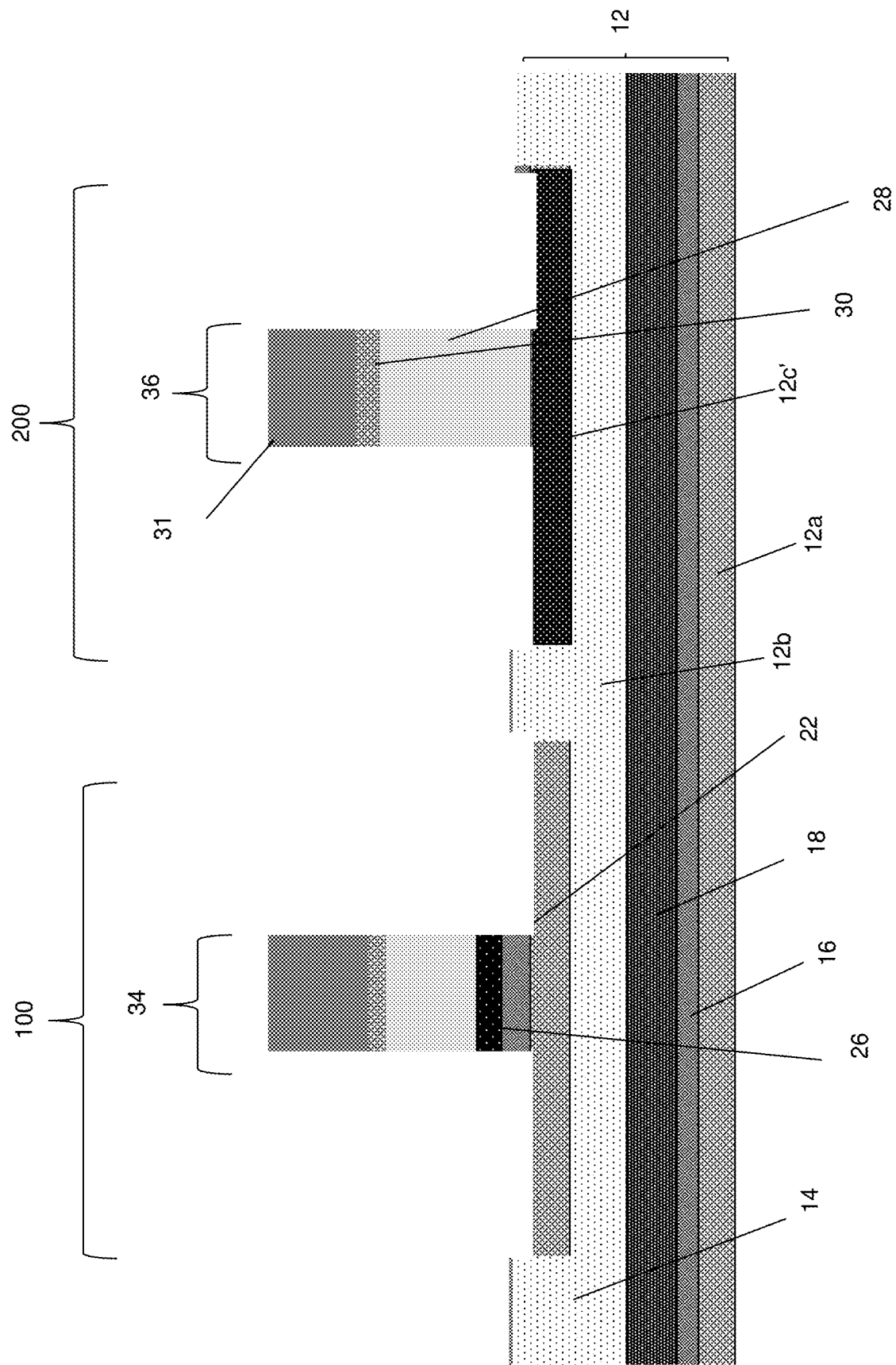
FIG. 9 shows a patterning of materials to form a gate structure and extrinsic base, amongst other features, and respective fabrication processes in accordance with aspects of the present disclosure.

FIG. 9 shows a patterning of the CMOS device and the extrinsic base region in the CMOS region and lateral bipolar transistor region, amongst other features. For example, in FIG. 9, a capping material 31 may be formed (e.g., deposited) over the insulator material 30 using a conventional deposition process, e.g., CVD. The materials 22, 26, 28, 30, 31 in region 100 and materials 28, 30, 31 in region 200 may be patterned using conventional lithography and etching techniques. The patterned materials 22, 26, 28, 30, 31 may form a gate structure 34; whereas the patterned materials 28, 30, 31 may form an extrinsic base region 36. In this way, the extrinsic base region 36 may be formed by conventional CMOS gate first processes. Also, in this way, the extrinsic base region may be a self-aligned extrinsic base provided by conventional gate patterning processes to enable a narrow base width of <40 nm. Also, in embodiments, the gate structure 34 and the extrinsic base region 36 will have a same height with the polysilicon material 28 shorter in the gate structure 34.

Figure 10:
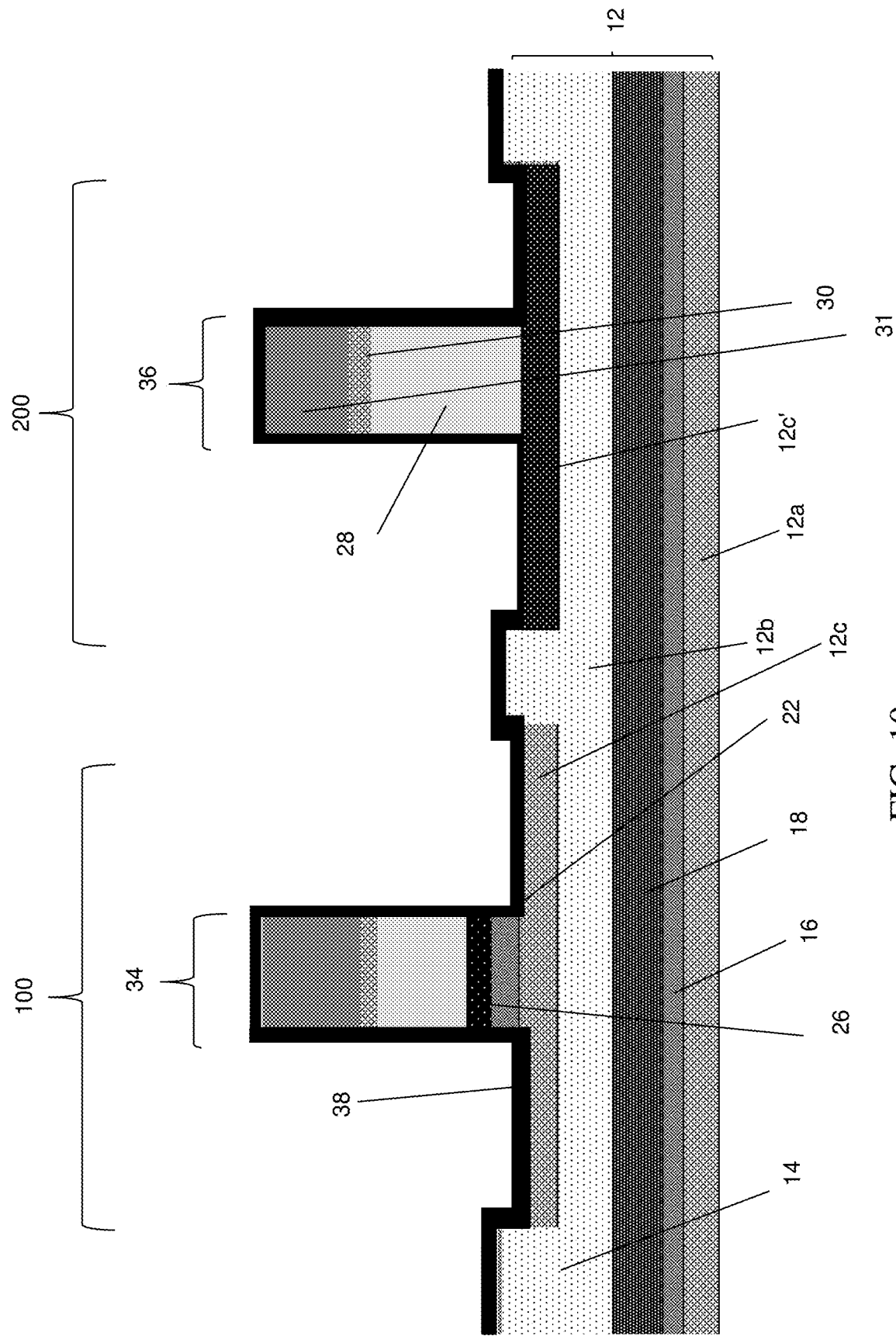
FIG. 10 shows sidewall spacer material on the gate structure and extrinsic base, amongst other features, and respective fabrication processes in accordance with aspects of the present disclosure.

In FIG. 10, subsequent to the patterning, a spacer material 38 may be formed, e.g., blanket deposited, over the gate structure 34 and extrinsic base region 36, in addition to the semiconductor layers 12c, 12c' in both regions 100, 200. In embodiments, the spacer material 38 may be a nitride and/or oxide material used to form a sidewall spacer on the extrinsic base region 36 and the gate structure 34.

Figure 11:
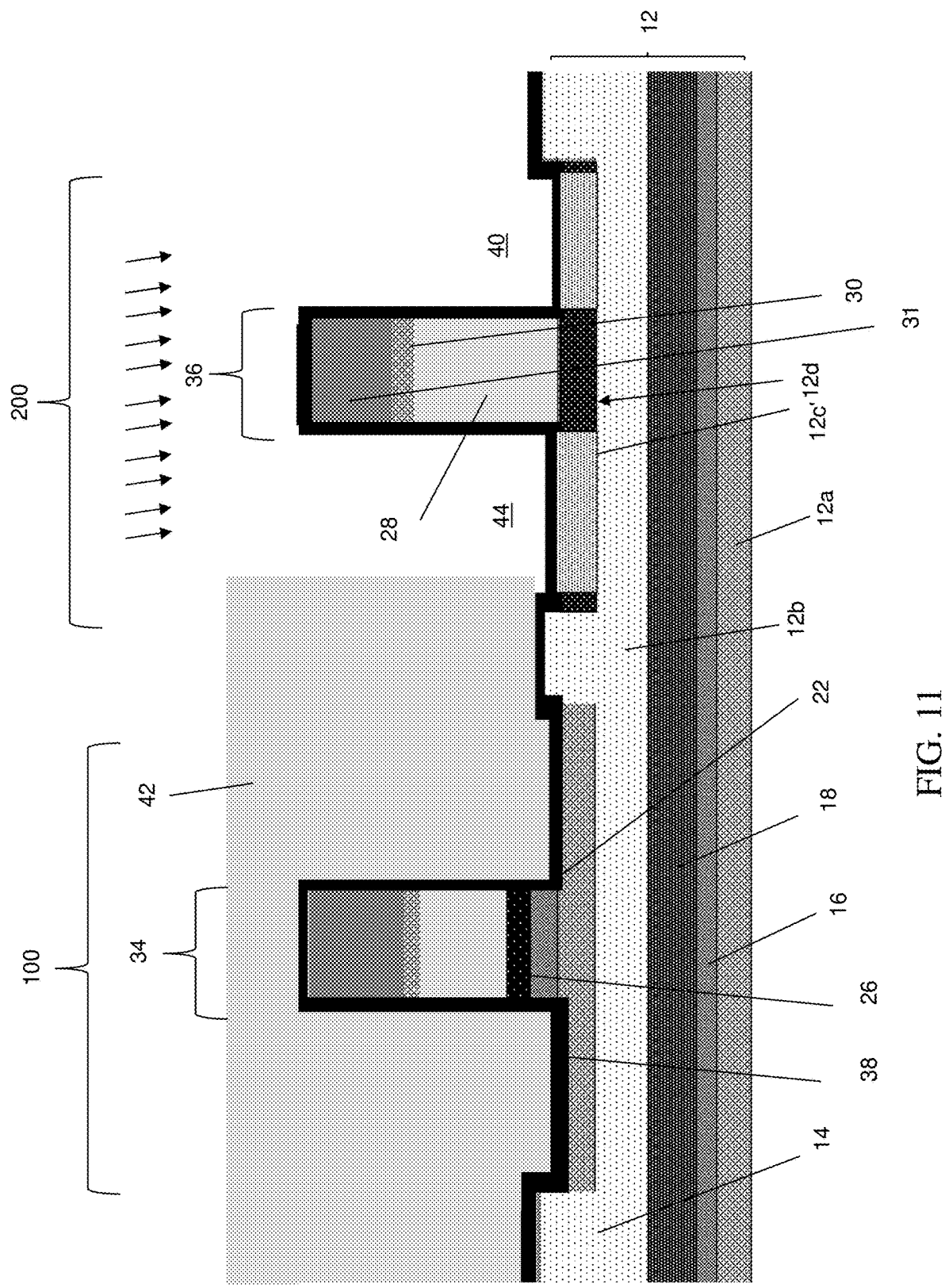
FIG. 11 shows an additional ion implantation process in the lateral bipolar transistor region to form an intrinsic collector region and intrinsic emitter region, amongst other features, and respective fabrication processes in accordance with aspects of the present disclosure.

In FIG. 11, the region 200 may undergo an additional ion implantation process, while blocking the region 100 with a mask 42. In embodiments, the ion implantation process will be performed on an emitter side 44 and collector side 40 of the region 200 using a n-type dopant, e.g., phosphorus. In this way, a p-n junction may be formed between the P+SiGe intrinsic base region 12d and the N+ regions for the emitter side 44 and collector side 40 of the lateral bipolar transistor.

The extrinsic base region 36 will effectively block the dopants from implanting into the intrinsic base region 12d, under the extrinsic base region 36. And it should be recognized that as the sidewall material 38 is provided on sidewalls of the extrinsic base region 36, the width of the extrinsic base region 36 may be slightly smaller than the width of the intrinsic base 12d.

Optionally, the dopant may be used to provide an asymmetrical device by additional N++ implantation into emitter side 44 with collector side 42 also blocked with the mask 42. In embodiments, a heavily doped N++ emitter may be used to reduce the base current and improve current gain of the lateral junction bipolar transistor.

Figure 12:
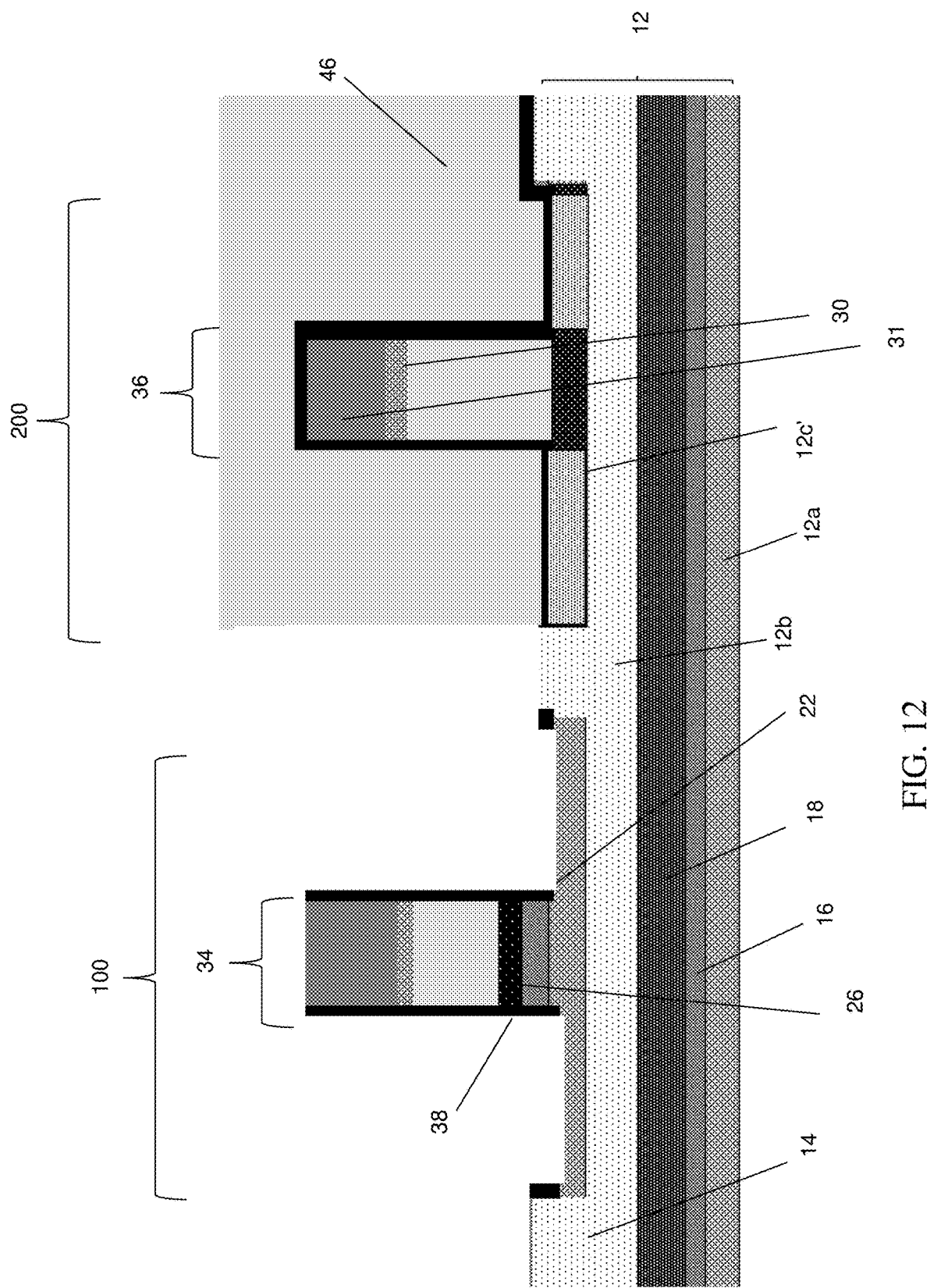
FIG. 12 shows sidewall spacers on the gate structure in the CMOS region, amongst other features, and respective fabrication processes in accordance with aspects of the present disclosure.

As further shown in FIG. 12, the region 100 will undergo an anisotropic etching process to remove the spacer material 38 on horizontal surfaces. In embodiments, the region 200 will remain protected by a mask 46 during this etching process. In this way, the spacer material 38 will still fully encapsulate or surround the extrinsic base region 36.

Figure 13:
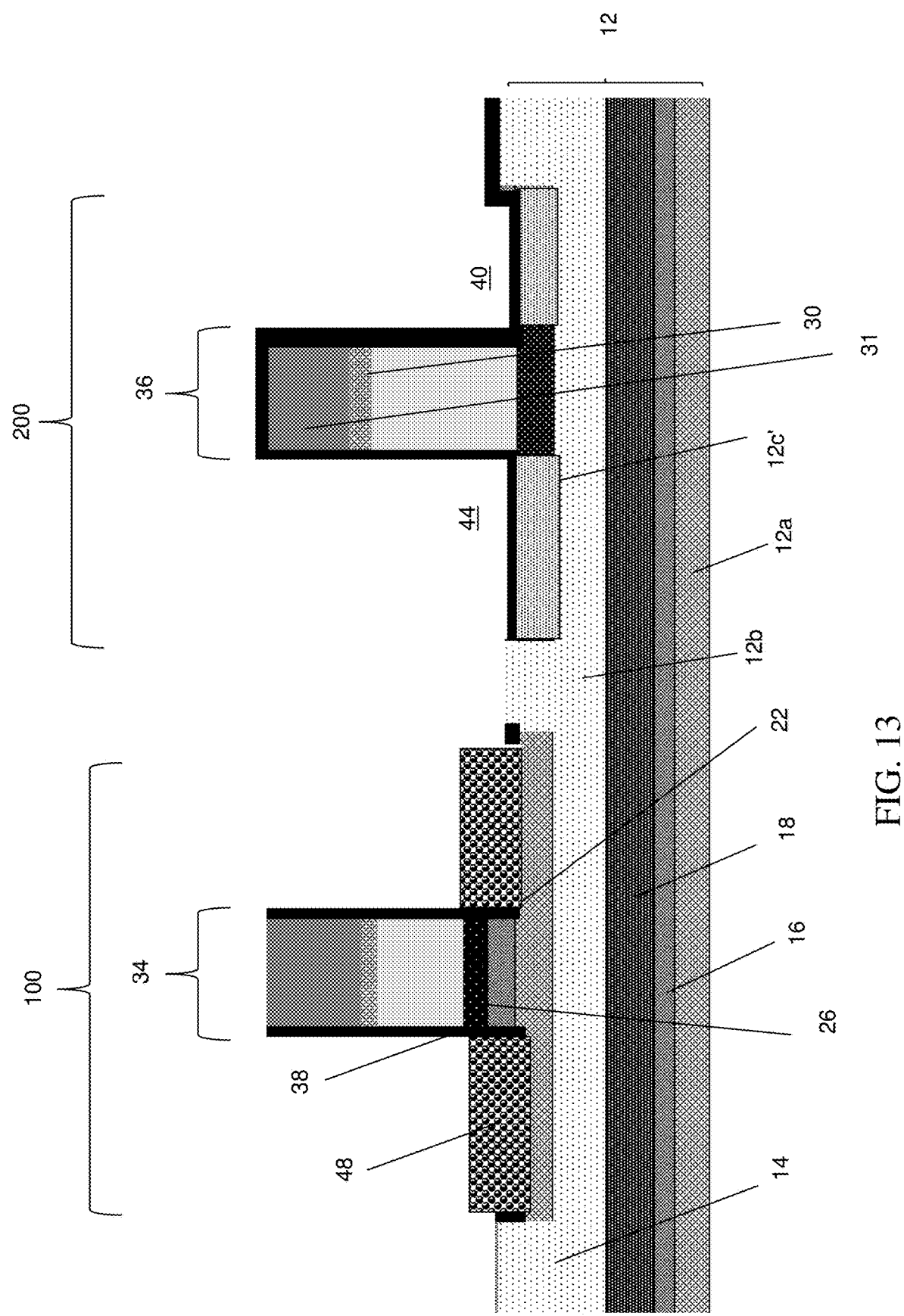
FIG. 13 shows diffusion regions for the gate structure in the CMOS region, amongst other features, and respective fabrication processes in accordance with aspects of the present disclosure.

In FIG. 13, diffusion regions 48 are provided on sides of the gate structure 34. In embodiments, the diffusion regions 48 may be raised source/drain regions which comprise epitaxially grown semiconductor material formed directly on the semiconductor layer 12c on sidewall spacer material 38 of the gate structure 34, e.g., between the gate structure 34 and the shallow trench isolation regions 14. The epitaxially grown semiconductor may be boron-doped SiGe material, with the boron applied in-situ during the growth process. In embodiments, the sidewall spacer 38 in region 200 will prevent epitaxial growth of the semiconductor layer 12c'.

Figure 14:
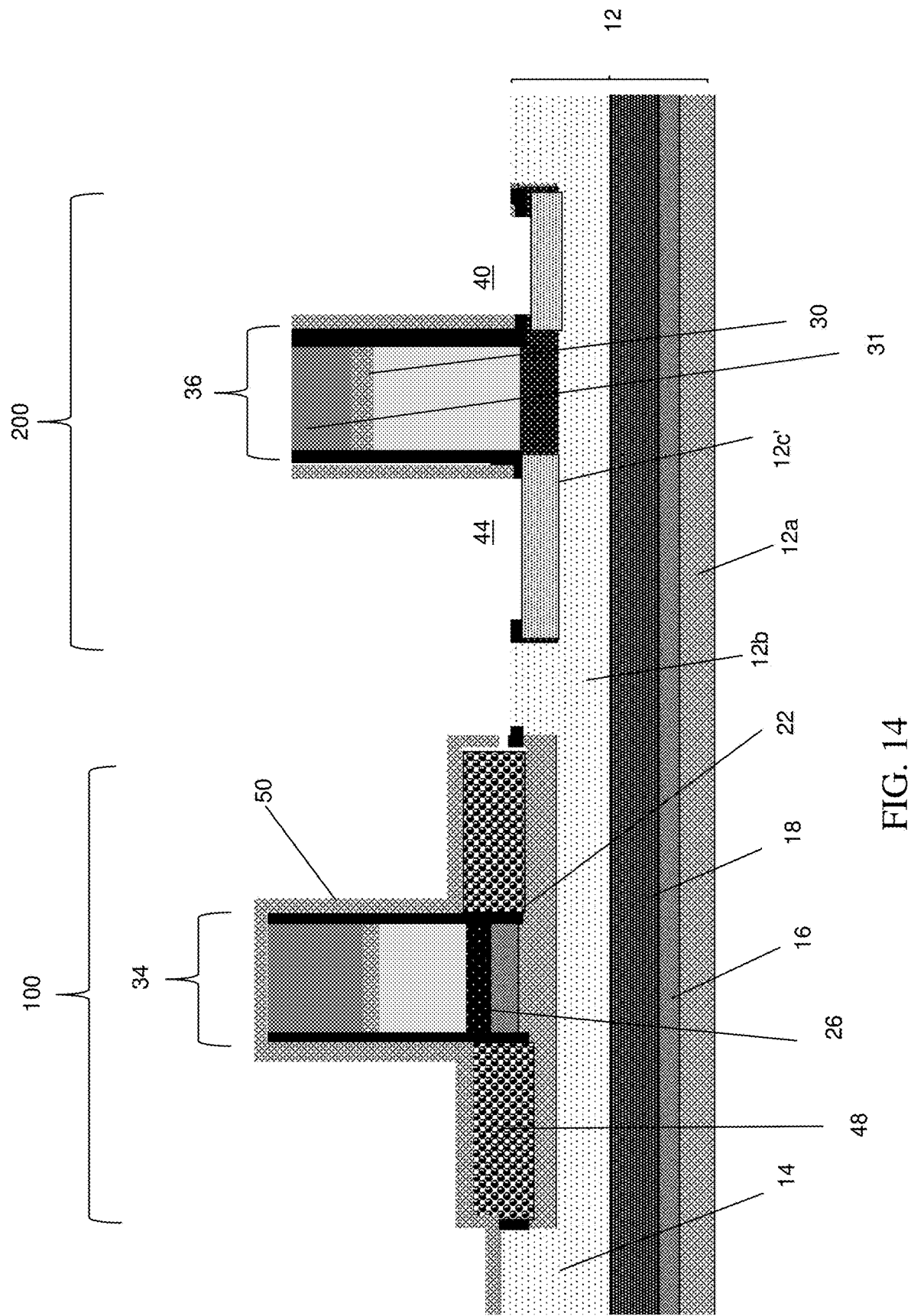
FIG. 14 shows a second spacer material on the extrinsic base, amongst other features, and respective fabrication processes in accordance with aspects of the present disclosure.

As further shown in FIG. 14, following the formation of the diffusion regions 48, a second spacer material 50 may be formed in regions 100, 200. More specifically, the spacer material 50 may be formed over the gate structure 34 and diffusion regions 48 in region 100, and the extrinsic base region 36 and semiconductor layer 12c' in region 200. The spacer material 50 may be an oxide or nitride material deposited by conventional deposition methods, e.g., CVD. In this way, there may now be a bilayer dielectric spacer (e.g., spacer material 38, 50) on sidewalls of the extrinsic base region 36, which will be at an interface and isolate the extrinsic base region 36 from the emitter region 44 and collector region 40. Also, as shown in FIG. 13, a p-n junction between the P+SiGe intrinsic base region 12d and the N+ regions 12c' for the emitter side 44 and collector side 40 of the lateral bipolar transistor will be under the bilayer dielectric spacer (e.g., spacer material 38, 50).

Still referring to FIG. 14, the spacer materials 38, 50 in region 200 will undergo an anisotropic etching process to remove the spacer materials 38, 50 on horizontal surfaces in region 200, while region 100 remains protected by a mask during this etching process. In this way, the spacer materials 38, 50 will still form a dual sidewall spacer structure on the extrinsic base region 36, while exposing the capping material 31 and the semiconductor layer 12c'.

Figure 15:
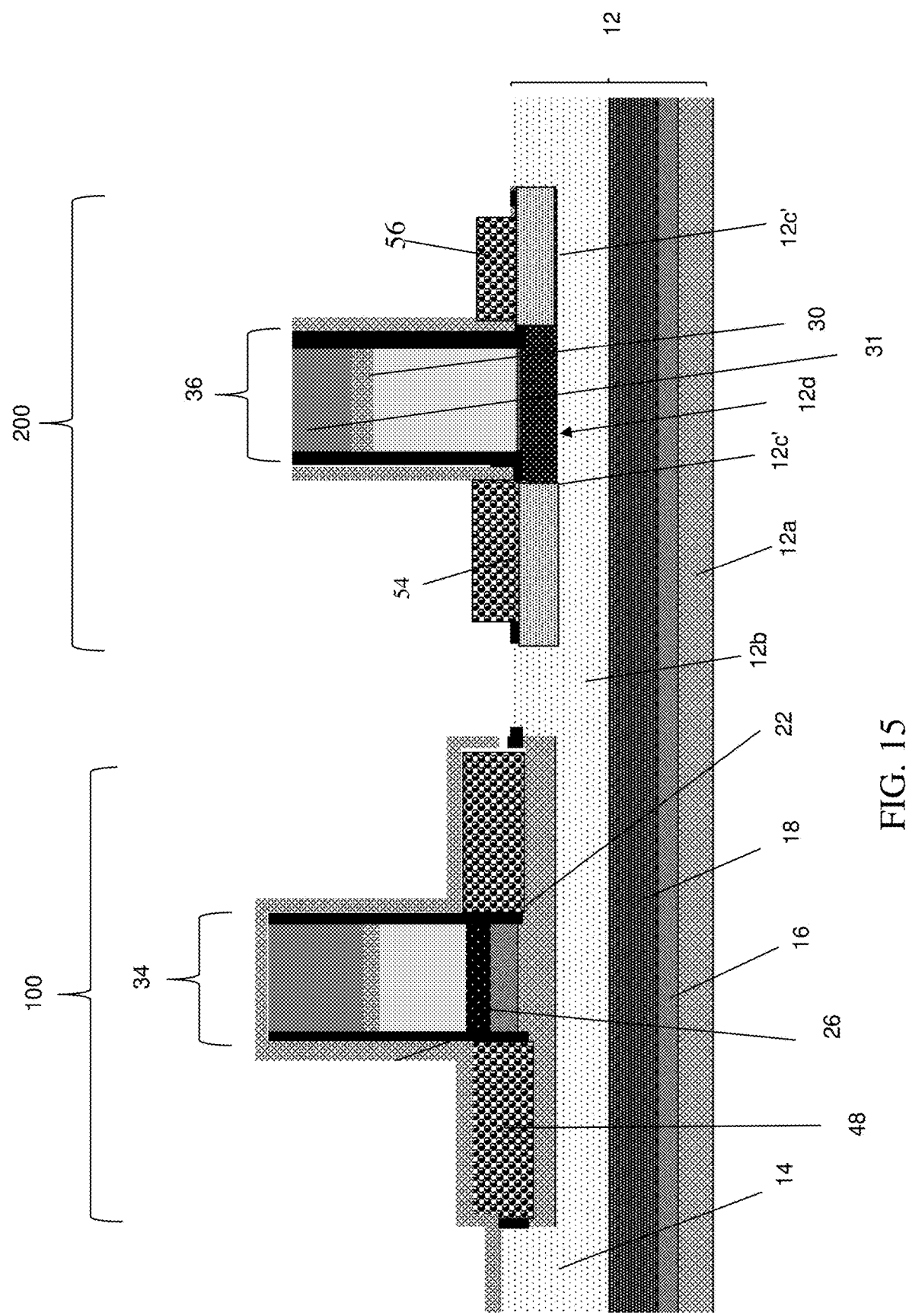
FIG. 15 shows a raised emitter region and a raised collector region formed on opposing sides of the extrinsic base, amongst other features, and respective fabrication processes in accordance with aspects of the present disclosure.

FIG. 15 shows a raised emitter region 54 and a raised collector region 56 may be formed on opposing sides of the extrinsic base region 36. In embodiments, the raised emitter region 54 and the raised collector region 56 may be a faceted epitaxial semiconductor grown material formed directly on the semiconductor layer 12c' (without the need to recess the semiconductor layer as in conventional process flows). The raised emitter region 54 (extrinsic emitter) and the raised collector region 56 (extrinsic collector) width is slightly smaller than the width of the intrinsic emitter and intrinsic collector as shown by reference numeral 12c'. Also, the raised emitter region 54 and the raised collector region 56 may be separated (e.g., not in contact with) from the intrinsic P+SiGe base region 12d by the spacer materials 38, 50 (e.g., bilayer dielectric spacer). In this way, it is now possible to either have symmetric homojunction N+SiGe(E)/P+SiGe(B)/N+SiGe(C) or an asymmetric homojunction N++SiGe(E)/P+SiGe(B)/N+SiGe(C), depending on the optional implantation process described in FIG. 11.

In more specific embodiments, the epitaxial semiconductor material may be SiP material lightly doped with N+ dopants. In accordance with aspects of the present disclosure, the N+ doped SiP material is formed on SiGe semiconductor layer 12c', thereby forming a lateral bipolar transistor. It should also be recognized that the sidewall spacers 38, 50 will also isolate the extrinsic base region 36 from both the raised emitter region 54 and raised collector region 56. Also, the epitaxial semiconductor material of the raised emitter region 54 and raised collector region 56 collector will reduce parasitic capacitance and resistance, which leads to significant $f_T$ and $f_{max}$ improvement.

Figure 16:
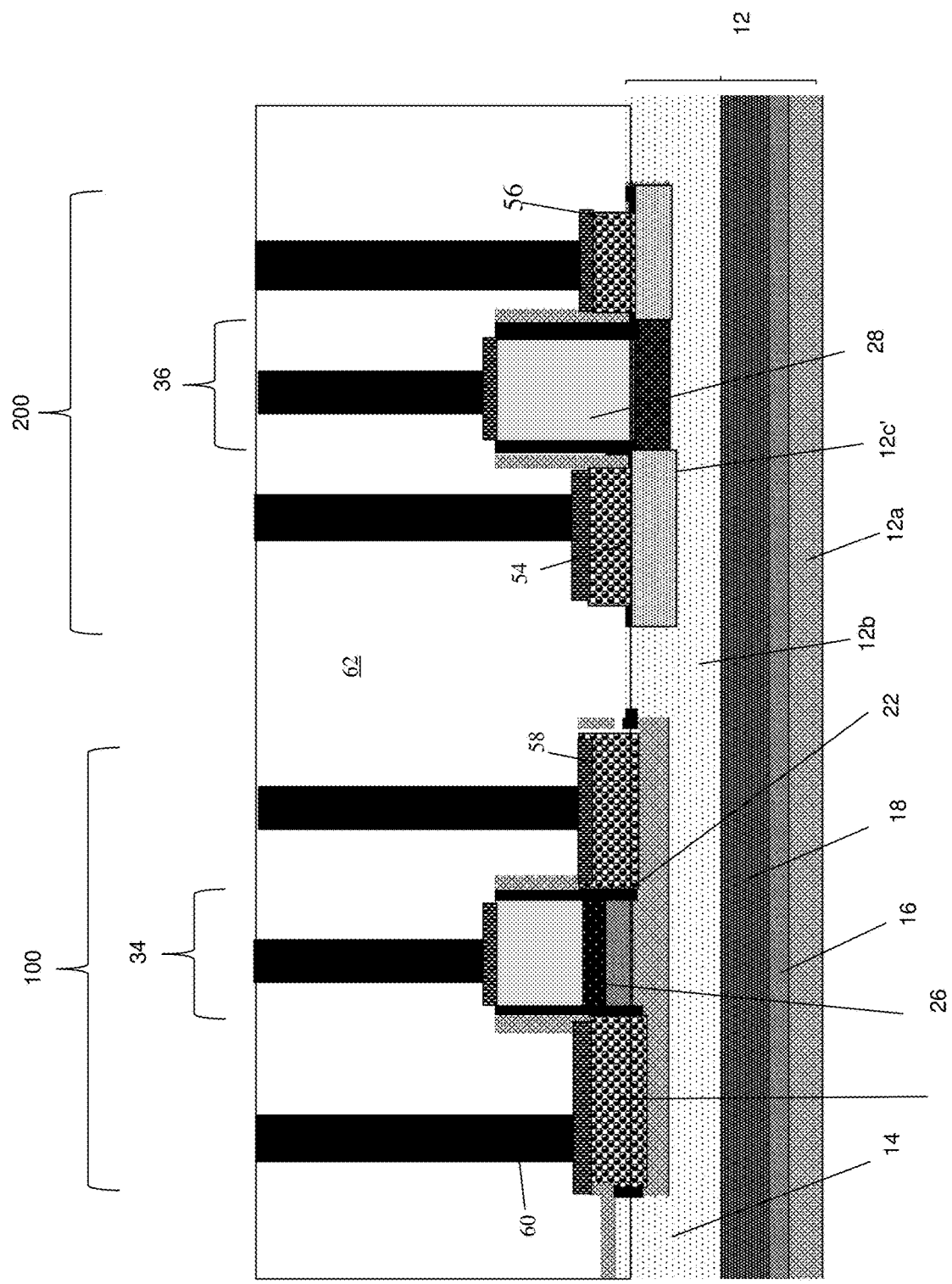
FIG. 16 shows contact formation, amongst other features, and respective fabrication processes in accordance with aspects of the present disclosure.

Referring to FIG. 16, the capping material 31 may be removed from the gate structure 34 and the extrinsic base region 36 using conventional selective etching processes. Accordingly, the polysilicon material 28 of the gate structure 34 and the extrinsic base region 36 are exposed. A silicide 58 may be formed over the raised emitter region 54 and the raised collector region 56, in addition to over the polysilicon material 28 of the extrinsic base region 36 and the gate structure 34. As should be understood by those of skill in the art, the silicide process begins with deposition of a thin transition metal layer, e.g., nickel, cobalt or titanium, over fully formed and patterned semiconductor devices (e.g., raised emitter region 54, the raised collector region 56, the extrinsic base region 36 and the gate structure 34). After deposition of the material, the structure is heated allowing the transition metal to react with exposed silicon (or other semiconductor material as described herein) in the active regions of the semiconductor device forming a low-resistance transition metal silicide. Following the reaction, any remaining transition metal is removed by chemical etching, leaving silicide contacts 58 in the active regions of the device.

Contacts 60 may be formed on the silicide 58. In embodiments, the contacts 60 may be tungsten or aluminum formed by conventional lithography, etching and deposition processes. For example, a capping material (not shown), e.g., nitride, and interlevel dielectric material 62 may be deposited over the structure, followed by via formation to expose the underlying silicide 58. The vias may be formed conventional lithography and etching processes. A conductive material, e.g., tungsten or aluminum, may be deposited within the vias to form the contacts 60. Any residual material on the interlevel dielectric material 38 may be removed by a CMP process.

The transistor can be utilized in system on chip (SoC) technology. The SoC is an integrated circuit (also known as a "chip") that integrates all components of an electronic system on a single chip or substrate. As the components are integrated on a single substrate, SoCs consume much less power and take up much less area than multi-chip designs with equivalent functionality. Because of this, SoCs are becoming the dominant force in the mobile computing (such as in Smartphones) and edge computing markets. SoC is also used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising a lateral bipolar junction transistor comprising an extrinsic base region and a bilayer dielectric spacer on sidewalls of the extrinsic base region and a p-n junction positioned under the bilayer dielectric spacer between the extrinsic base region and at least an emitter region, the p-n junction being within a buried insulator layer under the extrinsic base region and comprising an intrinsic region with different dopant types.

2. The structure of claim 1, wherein the p-n junction is positioned under the bilayer dielectric spacer between the extrinsic base region and a collector region, the p-n junction comprises P+ and N+SiGe material and the extrinsic base region, the emitter region and the collector region being raised regions.

3. The structure of claim 2, wherein the intrinsic region of the lateral bipolar junction transistor comprises an intrinsic emitter region and an intrinsic collector region in a same semiconductor substrate with a same thickness.

4. The structure of claim 3, wherein the intrinsic region further comprises an intrinsic base region under the extrinsic base region, the intrinsic base region comprising the same semiconductor substrate with the same thickness as the intrinsic emitter region and the intrinsic collector region.

5. The structure of claim 4, wherein the semiconductor substrate comprises semiconductor on insulator substrate material.

6. The structure of claim 3, wherein the p-n junction is at an interface of the intrinsic base region, the intrinsic emitter region and the intrinsic collector region, wherein the raised emitter region and the raised collector region are separated and not in contact with the intrinsic base region by the bilayer dielectric spacer such that the lateral bipolar junction transistor is either a symmetric homojunction N+SiGe(E)/P+SiGe(B)/N+SiGe(C) or an asymmetric homojunction N++SiGe(E)/P+SiGe(B)/N+SiGe(C).

7. The structure of claim 4, wherein the lateral bipolar junction transistor further comprises an extrinsic emitter and an extrinsic collector both of which have a smaller width than the intrinsic emitter region and the intrinsic collector region, respectively.

8. The structure of claim 1, wherein the lateral bipolar junction transistor further comprises a faceted emitter region and a faceted collector region on opposing sides of the extrinsic base region, wherein the bilayer dielectric spacer separates the faceted emitter region from the extrinsic base region and the faceted collector region from the extrinsic base region.

9. The structure of claim 8, wherein the faceted emitter region comprises an extrinsic emitter and the faceted collector region comprises an extrinsic collector both of which have a smaller width than the intrinsic emitter and the intrinsic collector, respectively.

10. The structure of claim 1, wherein the lateral bipolar junction transistor comprises symmetrical junctions under the extrinsic base region.

11. The structure of claim 1, wherein the lateral bipolar junction transistor comprises asymmetrical junctions under the extrinsic base region.

12. The structure of claim 1, further comprising a gate structure isolated from the lateral bipolar junction transistor.

13. The structure of claim 12, wherein the gate structure and the lateral bipolar junction transistor both comprise polysilicon material of a different height.

14. A structure comprising:
a lateral bipolar junction transistor comprising:
an extrinsic base region;
a bilayer dielectric spacer on sidewalls of the extrinsic base region;
an extrinsic collector separated from the extrinsic base region by the bilayer dielectric spacer;
an extrinsic emitter separated from the extrinsic base region by the bilayer dielectric spacer;
p-n junctions comprising an intrinsic region comprising semiconductor material embedded within a buried insulator material of a semiconductor on insulator substrate, the p-n junctions being below the bilayer dielectric spacer; and
a metal oxide semiconductor field effect transistor isolated from the lateral bipolar junction transistor, the metal oxide semiconductor field effect transistor comprising same semiconductor material as the extrinsic base region.

15. The structure of claim 14, wherein the intrinsic region of the lateral bipolar junction transistor comprises:
an intrinsic base under the extrinsic base region;
an intrinsic collector under the extrinsic collector; and
an intrinsic emitter under the extrinsic emitter,
wherein the intrinsic base, the intrinsic collector and the intrinsic emitter comprise a same semiconductor material of a same thickness.

16. The structure of claim 15, wherein the p-n junctions are located between the intrinsic base and the intrinsic collector and between the intrinsic emitter and the intrinsic base.

17. The structure of claim 16, wherein the p-n junctions under the bilayer dielectric spacer comprise N+ doped SiGe outer regions and P+ doped SiGe inner region.

18. The structure of claim 14, wherein the lateral bipolar junction transistor comprises a symmetrical device.

19. The structure of claim 14, wherein the lateral bipolar junction transistor comprises an asymmetrical device.

20. A method comprising:
forming a lateral bipolar junction transistor comprising an extrinsic base region and a bilayer dielectric spacer on sidewalls of the extrinsic base region; and
forming a p-n junction positioned under the bilayer dielectric spacer between the extrinsic base region and at least an emitter region, the p-n junction being formed within a buried insulator layer under the extrinsic base region and comprising an intrinsic region with different dopant types.

\* \* \* \* \*